US006424279B1

(12) United States Patent
Kim et al.

(10) Patent No.: US 6,424,279 B1
(45) Date of Patent: Jul. 23, 2002

(54) SIGMA-DELTA ANALOG-TO-DIGITAL CONVERTER USING MIXED-MODE INTEGRATOR

(75) Inventors: Beomsup Kim, Taejon-si; Taehoon Kim, Seoul, both of (KR)

(73) Assignee: Korea Advanced Institute of Science and Technology, Taejon-si (KR)

( * ) Notice: Subject to any disclaimer, the term of this patent is extended or adjusted under 35 U.S.C. 154(b) by 0 days.

(21) Appl. No.: 09/598,625

(22) Filed: Jun. 21, 2000

(30) Foreign Application Priority Data

Jun. 26, 1999 (KR) .............................................. 99-24402

(51) Int. Cl.[7] .............................................. H03M 3/00
(52) U.S. Cl. ....................... 341/143; 341/123; 341/131; 341/143; 341/144
(58) Field of Search ................................ 341/143, 144, 341/123, 131

(56) References Cited

U.S. PATENT DOCUMENTS 5,148,167 A * 9/1992 Ribner ........................ 341/143
5,790,062 A * 8/1998 Darnell ....................... 341/143
5,982,313 A   11/1999 Brooks et al. .............. 341/143
5,986,598 A   11/1999 Mittel ........................ 341/143
6,020,836 A * 2/2000 Tlaskal ....................... 341/143
6,040,793 A * 3/2000 Ferguson .................... 341/143

* cited by examiner

*Primary Examiner*—Michael Tokar
*Assistant Examiner*—Khai Nguyen
(74) *Attorney, Agent, or Firm*—Bachman & LaPointe, P.C.

(57) ABSTRACT

The present invention relates to a sigma-delta analog-to-digital converter using a mixed mode integrator composed of an analog integrator and a digital integrator, which can prevent the performance degradation due to the saturation of an integrator of the overload of a quantizer. A sigma-delta analog-to-digital converter having an anti-aliasing filter, a sample and hold circuit, a sigma-delta modulator and a decimation filter comprises an overload estimating unit for judging the saturation or overload of an analog integrator; a mixed mode integrator which has the analog integrator and a digital integrator composed of a digital adder and a digital storing unit and integrates the output of the overload estimating unit in analog or digitally; and a quantization unit for converting the output of the mixed mode integrator to a digital signal.

3 Claims, 6 Drawing Sheets

SIGMA-DELTA ANALOG-TO-DIGITAL CONVERTER USING MIXED-MODE INTEGRATOR

BACKGROUND OF THE INVENTION

1. Field of the Invention

The present invention relates generally to a sigma-delta analog-to-digital converter which can have a high resolution, and more particularly to an improved sigma-delta analog-to-digital converter using a mixed mode integrator composed of an analog integrator and a digital integrator, which can prevent the performance degradation due to the distortion of an analog circuit, i.e., the saturation of an integrator or the overload of a quantizer.

2. Description of the Related Art

A general sigma-delta analog-to-digital converter has an anti-aliasing filter, a sample and hold circuit, a sigma-delta modulator and a decimation filter, as shown in FIG. 1b.

The sigma-delta analog-to-digital converter of such construction can ensure high resolution with the help of the oversampling and the signal processing in a digital area without requiring high accuracy analog circuit and filter, and with this reason, it is widely used as a converter of an audio signal or a baseband signal requiring high resolution. However, this converter has a problem that an analog signal of high frequency cannot be converted to a digital signal because it uses the oversampling. That is, if an oversampling ratio is raised, the resolution can be improved, but the frequency of the convertible analog signal becomes lowered, thus limiting the application field thereof.

Meanwhile, there are two methods to enhance the resolution of the sigma-delta analog-to-digital converter without increasing the oversampling ratio.

The first method is that quantization is executed by multi-bits instead of 1 bit. However, this method requires a multi-bit DAC (digital-to-analog converter) having a linearity of high resolution, resulting in a complicated circuit design and a high manufacturing cost. Two conventional methods have been proposed to solve this problem: one is to correct the nonlinearity of the multi-bit DAC in a digital signal processing and the other is to execute the multi-bit quantization without using the multi-bit DAC. But such techniques is limited to a specific modulator construction and requires a complicated construction.

The second method is to raise the order of the sigma-delta converter. However, in the case of a higher order modulator over a third order, the converter becomes unstable. Such an instability of the higher order modulator is associated with the leakage of the output of an integrator of the modulator and this leakage causes the saturation due to the limit of a linear region of the analog integrator or the overload of the quantizer, resulting in a rapid performance degradation of the sigma-delta modulator. That is, the voltages on the output of the analog integrator of the analog-to-digital converter are continuously increased or reduced and are finally limited by a power. In fact, the voltages are passed over the linear region of the operation amplifier before that, and thus it is impossible to ensure a normal operation. Such a phenomenon is called a saturation or an overload, and this can affect the stability of the converter. Particularly, the higher the order of the sigma-delta analog-to-digital converter is, the more unstable the whole system is. Further, the harmonic distortion at the output signal components of the modulator causes the reduction of the signal to noise ratio of the outputs, thus deteriorating the resolution of the converter.

To solve such a problem that a higher order sigma-delta analog-to-digital modulator becomes unstable, several methods have been used.

The first method is to control the gain and feedback gain of the integrator by a simulation. However, since there are many variables to be considered, it is impossible to perform a simulation on all cases, and thus this is a rather unstable method.

The second method is to provide an interpolative modulator which designs the transmission characteristic of an analog modulator with a filter concept. However, the counter of the filter requires a higher accuracy.

The third method is to provide a cascaded modulator known as MASH configuration, but this requires an exact matching between cascaded blocks.

SUMMARY OF THE INVENTION

It is therefore, an object of the present invention to provide a sigma-delta analog-to-digital converter which ensures the stability of a higher order modulator, prevents the performance degradation by removing a saturation or overload phenomenon of a modulator in the converter by applying a mixed mode integrator to the sigma-delta analog-to-digital converter and performs a multi-bit quantization without a multi-bit DAC

BRIEF DESCRIPTION OF THE DRAWINGS

The above and other objects, features and advantages of the present invention will become more apparent from the following detailed description when taken in conjunction with the accompanying drawings in which:

FIG. 6 is a diagram showing the result of a simulation of a construction to which FIGS. 2 and 4 are applied;

DETAILED DESCRIPTION OF THE PREFERRED EMBODIMENT

A technical construction of the present invention for achieving the above object will be described in detail with reference to the accompanying drawings.

Firstly, the concept of a mixed mode integrator will be discussed herein below.

An analog value, e.g., a value of 1.34 can be represented by the addition of an analog value of 0.34 and a digital value of 1. That is, 1.34 can be expressed by using an analog value displayer which can express only the fractional values between −1 and 1 and a digital value display which can show integer values. If it is the output of an integrator, the fractional value will be the output of an analog integrator and the integer value will be the output of a digital integrator. Hence, the output of the conventional analog integrator can be replaced by the sum of the output of the analog integrator and the output of a digital integrator. With this concept, a conventional analog integrator can be replaced by a mixed mode integrator in which the analog integrator is combined with the digital integrator.

Figure 1:
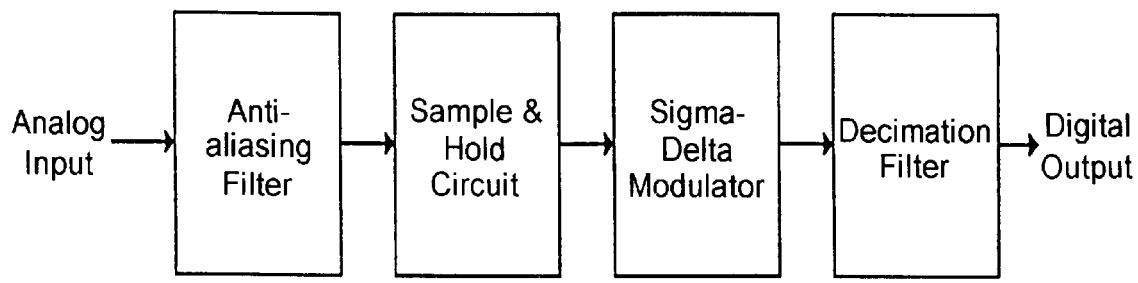
FIG. 1 is a block diagram showing a construction of a general sigma-delta converter.
Figure 2A:
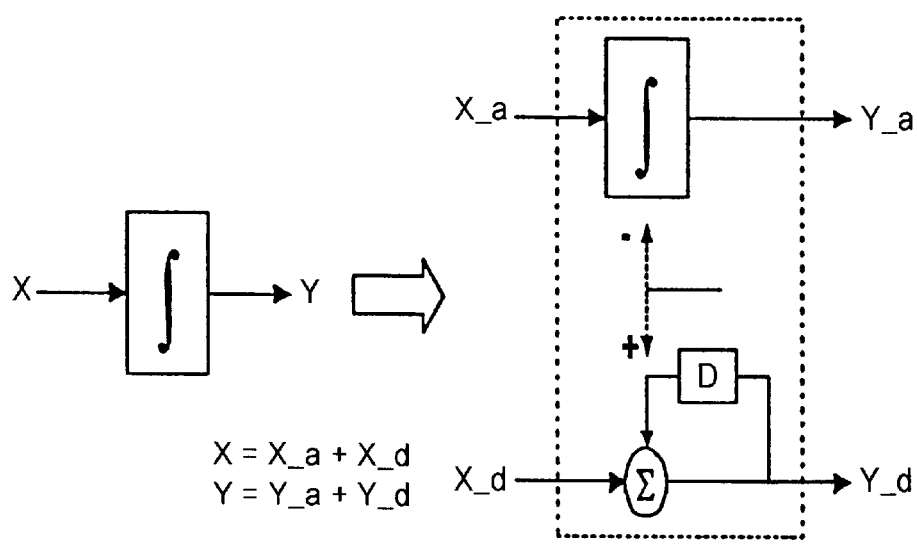
FIG. 2A is a concept diagram showing a mixed mode integrator.
Figure 2B:
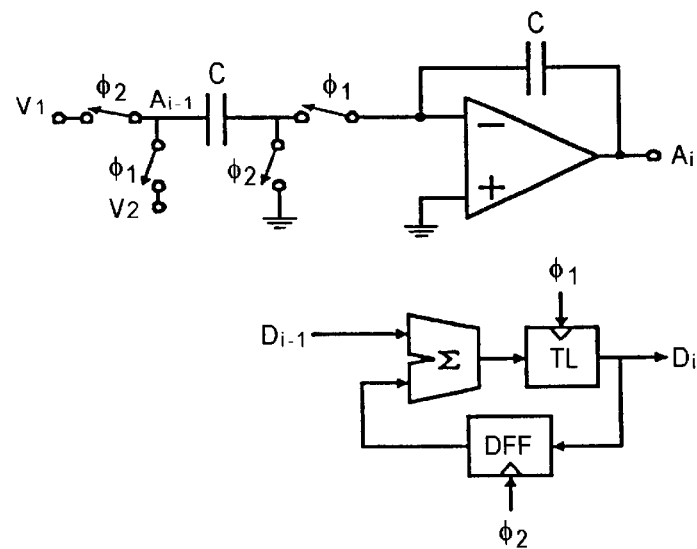
FIG. 2B is a circuit diagram showing a mixed mode integrator.

FIG. 2A is a concept diagram showing a mixed mode integrator and FIG. 2B is a circuit diagram showing the mixed mode integrator.

In the mixed mode integrator of the present invention, the analog value is processed (X_a, Y_a) by the analog integrator and the digital value is processed (X_d, Y_d) by the digital integrator. But, the sum of two integrators is equal to the value obtained when only the analog integrator is used in the conventional integrator. That is, X=X_a+X_d and Y=Y_a+Y_d.

A conventional analog integrator can express only from −Vref to +Vref, but the mixed mode integrator can express up to an infinite magnitude in theory if there is no limit on the bit of the digital integrator.

Figure 3A:
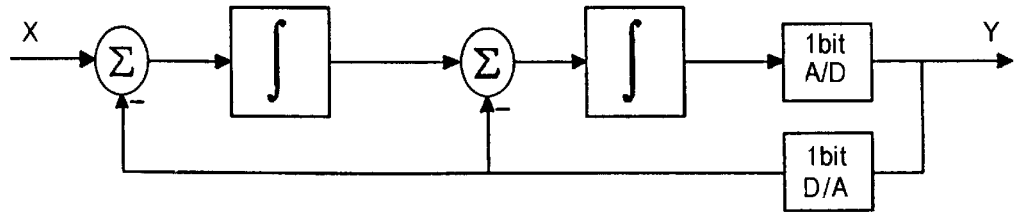
FIG. 3A is a circuit diagram showing a second order analog modulator according to a prior art.
Figure 3B:
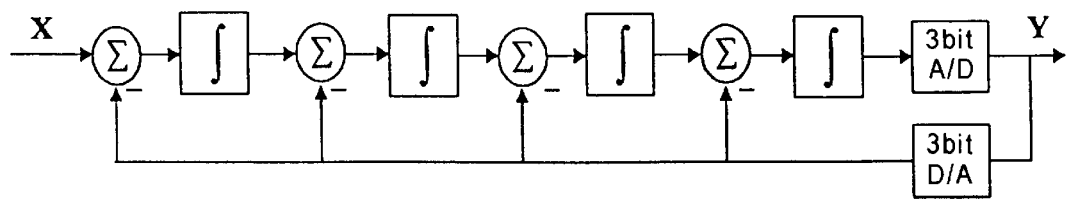
FIG. 3B is a circuit diagram showing a fourth order analog modulator according to a prior art.
Figure 4A:
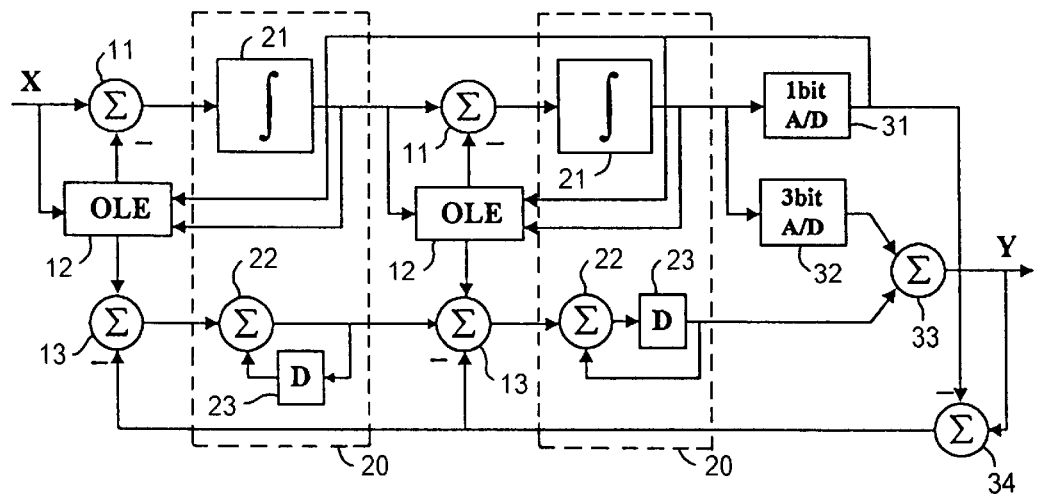
FIG. 4A is a circuit diagram showing a second order sigma-delta analog-to-digital modulator using a mixed mode integrator according to a preferred embodiment of the present invention.
Figure 4B:
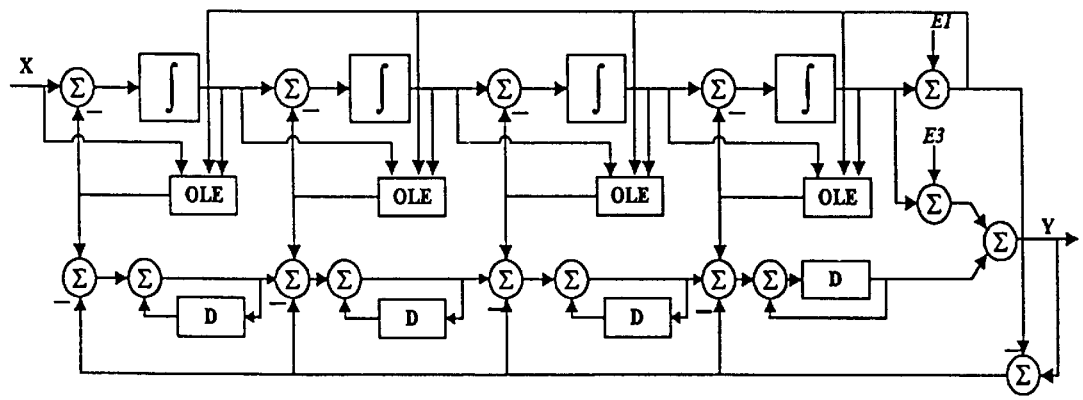
FIG. 4B is a circuit diagram showing a fourth order sigma-delta analog-to-digital modulator using a mixed mode integrator according to a preferred embodiment of the present invention.

FIGS. 4A and 4B show second and fourth order sigma-delta analog-to-digital modulators used in the sigma-delta analog-to-digital converter using a mixed mode integrator of the present invention instead of the analog integrator used in the conventional second and fourth order analog modulators of FIGS. 3A and 3B.

The sigma-delta analog-to-digital modulator used in the present invention is widely divided into three parts as shown in FIGS. 4A and 4B.

That is, the sigma-delta analog-to-digital modulator comprises an overload estimating unit having a digital adder 11 for adding an input signal to an output signal of an overload estimator 12, the overload estimator 12 for receiving the input signal, the output of an analog integrator 21 and the output of a 1 bit A/D converter 31 and previously estimating the overload state of a mixed mode integrator 20, and a digital adder 13 for adding the output of the overload estimator 12 to the signal obtained by adding the final output of the modulator to the output of the 1 bit A/D converter 31 via a digital adder 34; the mixed mode integrator 20 having analog integrator 21 for integrating the analog output of the digital adder 11, and a digital integrator which integrates the digital output of the digital adder 13 and has a digital adder 22 and a digital storing part 23; and a quantization unit having the 1 bit A/D converter 31 for A/D converting 1 bit of the output of the analog integrator 21 and feedback the A/D converted value in analog to the overload estimating unit, a 3 bit or N bit (greater than 2) A/D converter 32 for A/D converting 3 bits of the output of the analog integrator 21, a digital adder 33 for adding the output of the 3 bit A/D converter 32 to the output of the digital integrator, and the digital adder 34 for adding the output of the 1 bit A/D converter 31 to the final output of the modulator and digitally feedback the added value to the overload estimating unit.

The modulator has as many overload estimating units and mixed mode integrators 20 as the order of the modulator. That is, if the modulator is a second order modulator, it has two overload estimating units and two mixed mode integrators 20 as shown in FIG. 4A, while if the modulator is a fourth order modulator, it has four overload estimating units and four mixed mode integrators 20 as shown in FIG. 4B.

As described above, instead of existing analog integrator, the mixed mode integrator is used at the second and fourth order sigma-delta analog-to-digital modulators. Thus, in the case of the signal escaped from a linear region of the analog integrator, the output of the analog integrator can be expressed in the linear region without changing the value of the sum of two integrators by subtracting a predetermined digital value and adding the same value at the digital integrator to compensate the subtracted value.

Hence, with the use of the mixed mode integrator, the saturation of overload can be prevented by providing wider linear region to the output of the integrator, enabling a stable higher order modulator over a second order.

Further, in the conventional sigma-delta analog-to-digital converter, if the size of an input signal is over a predetermined value, the harmonic distortion is increased due to the saturation, thus reducing the signal to noise ratio.

However, in the present invention, with the use of the mixed mode integrator, the distortion is not generated even though the input signal becomes great, thereby preventing the reduction of the signal to noise ratio.

The mixed mode integrator is composed of the analog integrator and the digital integrator. In the case of applying the multi-bit quantization, if the amount of feedback can be expressed via the 1 bit D/A converter, it is fed back to the analog integrator. If the amount of the feedback can be expressed only via the multi-bit D/A converter, it is possible to feedback the digital signal to the digital integrator without converting the digital signal to the analog signal. Therefore, it is possible to perform the multi-bit quantization without the multi-bit D/A converter.

In order to estimate the saturation or overload of the integrator, each integrator of the modulator of the present invention has means for estimating the saturation or overload. In the prior art, since the overload of the integrator is estimated from the output of the integrator, to compensate the integrator, if it is estimated that the integrator is overloaded, the output of the integrator is changed to the value obtained after the compensation. This means that the operation time of the integrator is increased, which causes the deterioration of high speed operation.

However, in the present invention, the overload is estimated at a previous cycle not from the output of the integrator. That is, the overload of the integrator is estimated by previously obtaining the output value of the integrator at the previous cycle by using an analog adder (the overload estimating unit has an analog adder). Thereby, it is possible to solve the problem in the prior art. Particularly, even the case of the analog adder of differential structure, it is possible to simply construct the analog adder by several MOS transistors and two capacitors. In the present invention, it is called the overload estimating unit in that the overload is not judged after the generation of the overload but is previously judged.

Figure 5A:
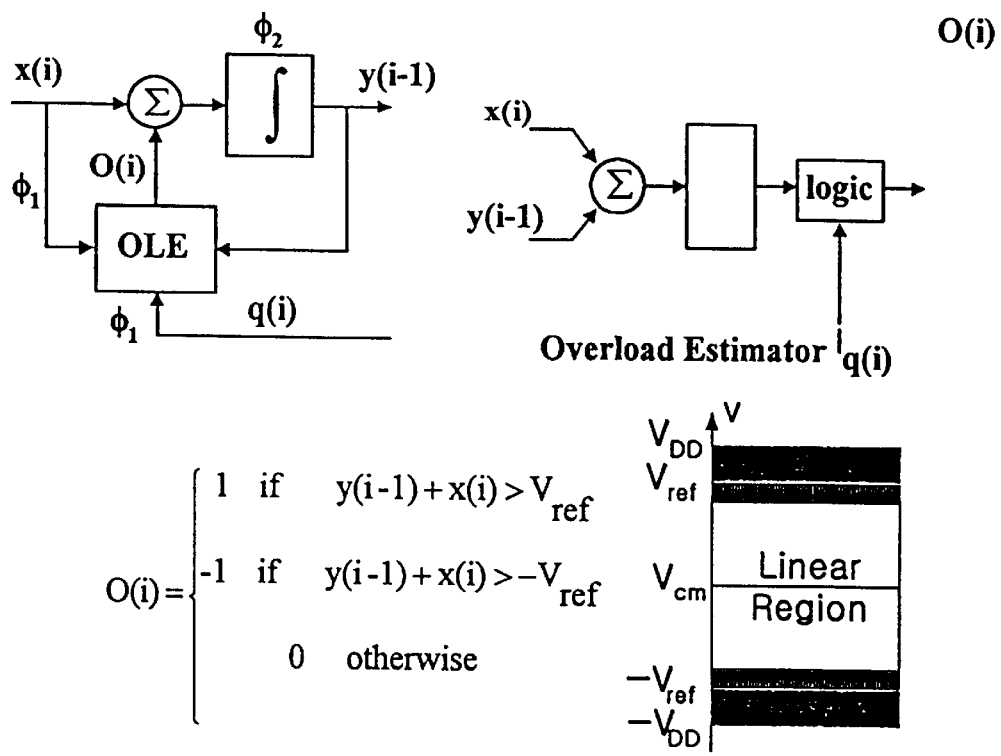
FIG. 5A is a block diagram showing an overload estimator according to the present invention.
Figure 5B:
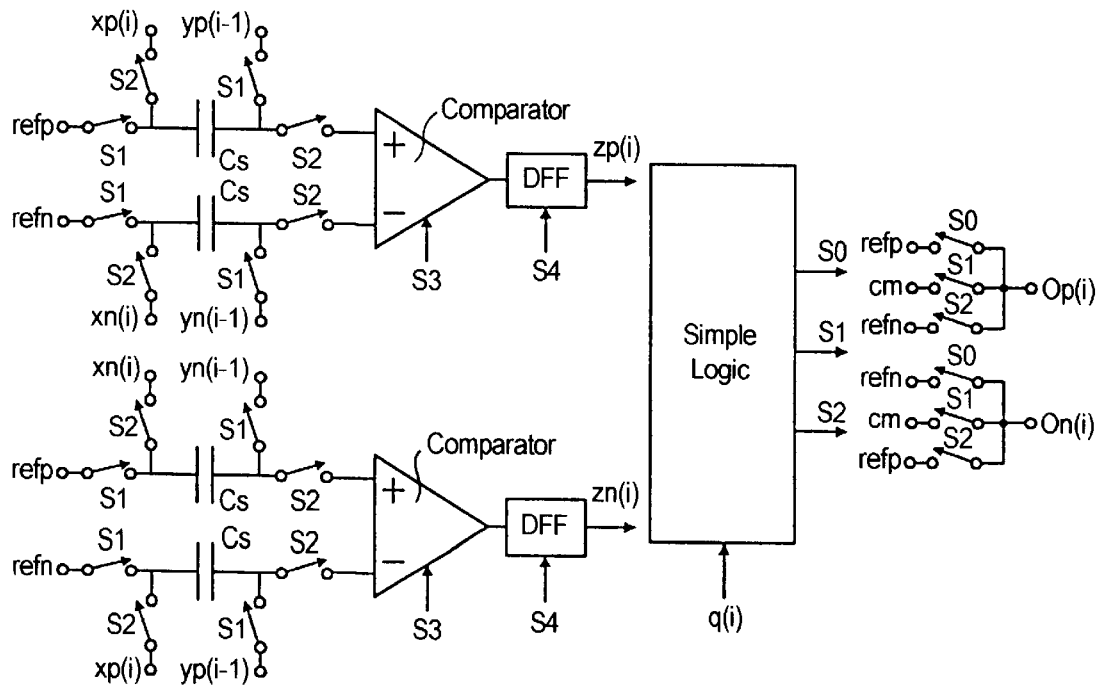
FIG. 5B is a circuit diagram showing an overload estimator according to the present invention.

FIG. 5A is a block diagram showing the overload estimator 12, and FIG. 5B is a circuit diagram showing a differential structure of the overload estimator 12.

The overload estimator 12 aimed at integrating the input value of the analog integrator 21, comparing the result value (xp4yp, xn+yn) with a limitation (refp, refn) and subtracting a value corresponding to the digital value if the result value is over the limitation. It is needed a 3 level D/A converter to subtract the analog value corresponding to the digital value, and the output thereof (Op, On) is the value to be compensated. If Op=refp, 1 is subtracted, if Op=refn, −1 is subtracted, and if Op=cm, 0 is subtracted.

Figure 6:
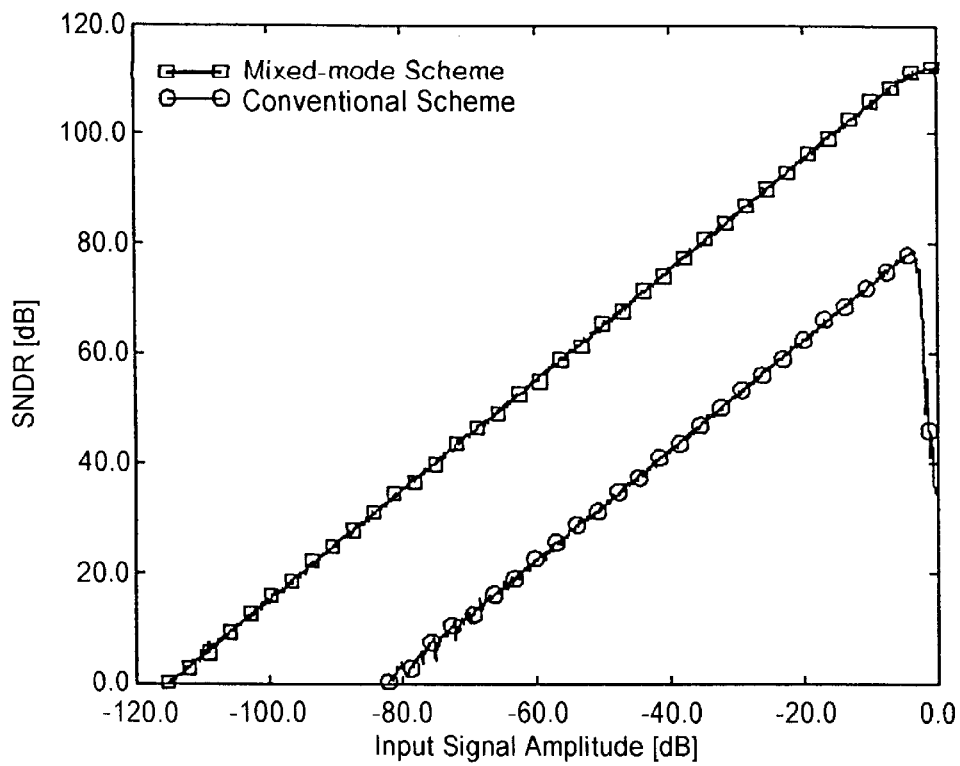

FIG. 6 shows a result of a simulation of the converter to which the structure of FIGS. 4 and 5 are applied.

The sine wave of 20 kHz is input with varying the amplitude thereof, the oversampling rate is 100 and the sampling frequency is 40 Mnz. The mixed mode structure has a greater signal to noise ratio as compared with the conventional technique.

In addition, the mixed mode integrator can be applied to various types of structures.

Figure 7:
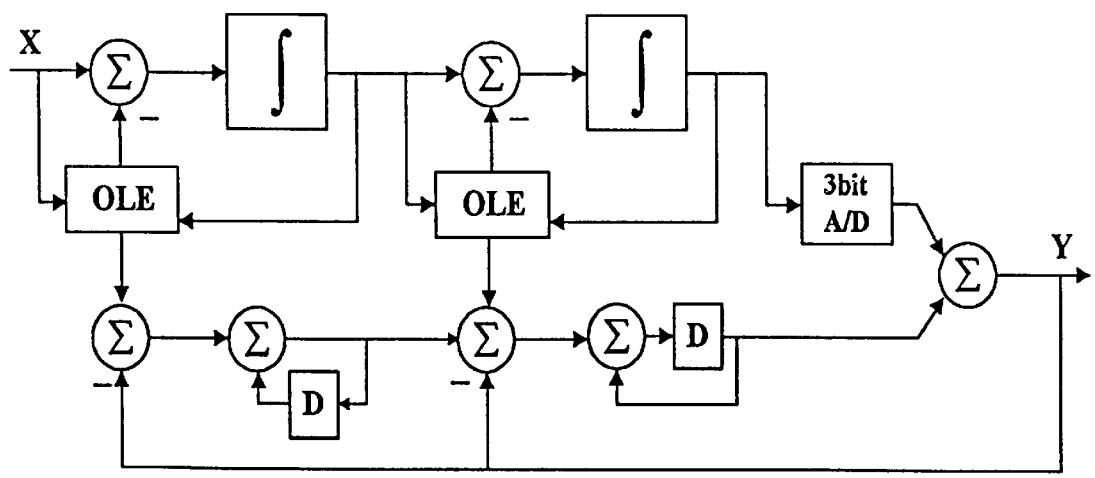
FIG. 7 is a circuit diagram showing second and fourth order sigma-delta analog-to-digital modulators using a mixed mode integrator according to another preferred embodiment of the present invention.

FIG. 7 shows another preferred embodiment of the second order sigma-delta analog-to-digital modulator using the mixed mode integrator according to the present invention, in which the feedback is performed from the quantization part not to the analog integrator but to the digital integrator. Therefore, the problem of stability at the analog circuit can be solved.

Figure 8:
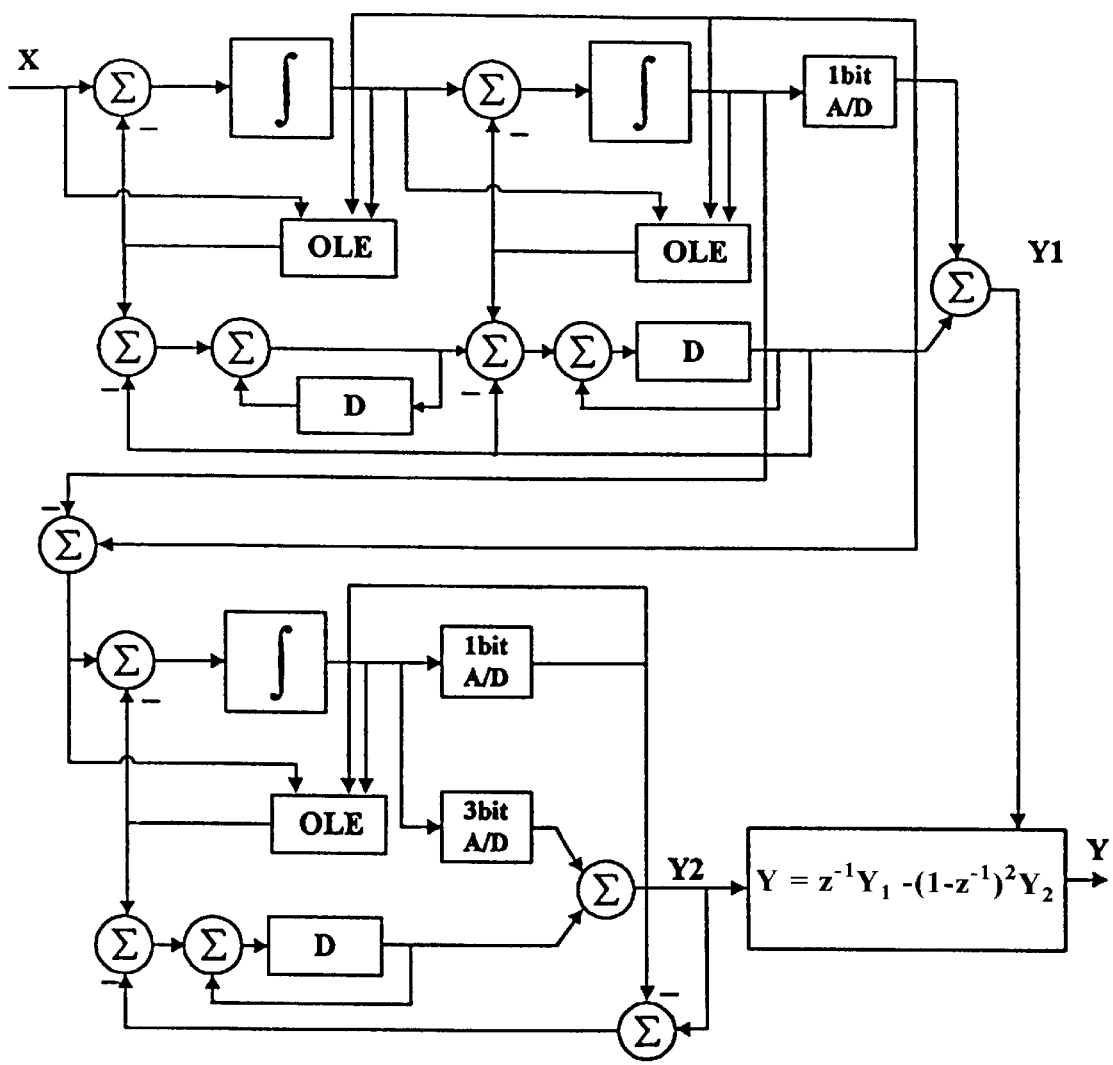
FIG. 8 is a circuit diagram showing a third order sigma-delta analog-to-digital modulator.

FIG. 8 shows an example wherein the mixed mode integrator is applied to the third order MASH sigma-delta analog-to-digital modulator. It is characterized in that it has no counter for controlling the gains at the previous and next stages of the integrator unlike other MASH modulators.

The gain at the previous stage of the integrator serves to drop the performance of the modulator, i.e., the signal to noise ratio. Therefore, it is better not to control the gain, and the difficulty in obtaining correct gain may degrade the performance thereof.

As described above, the higher order sigma-delta analog-to-digital converter of the present invention comprises the mixed mode integrator having the analog integrator and the digital integrator, and the overload estimator for estimating if the analog integrator is overloaded or not, thus enabling a high resolution without the instability of the system or the harmonic distortion.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A sigma-delta analog-to-digital converter having an optional anti-aliasing filter, an optional sample and hold circuit, a sigma-delta modulator and an optional decimation filter, comprising:

an overload estimating unit for judging the saturation or overload of an analog integrator;

a mixed mode integrator which has an analog integrator and a digital integrator composed of a digital adder and a digital storing unit and integrates the output of said overload estimating unit in analog or digitally; and a quantization unit for converting the output of said mixed mode integrator to a digital signal, wherein said quantization unit comprises a 1 bit A/D converter for A/D converting 1 bit of the output of said analog integrator and feedback the A/D converted bit in analog to said overload estimating unit; a N bit A/D converter for A/D converting N bits of the output of said analog integrator; a first digital adder for adding the output of said N bit A/D converter to the output of said digital integrator; and a second digital adder for adding the output of said 1 bit A/D converter to the final output of the modulator and digitally feedback the sum to said overload estimating unit, an N-th order sigma-delta modulator having N overload estimating units and N mixed mode integrators.

2. A sigma-delta analog-to-digital converter having an optional anti-aliasing filter, an optional sample and hold circuit, a sigma-delta modulator and an optional decimation filter, comprising:

an overload estimating unit for judging the saturation or overload of an analog integrator, wherein said overload estimating unit comprises a third digital adder for adding an input signal to the output signal of an overload estimator; said overload estimator for receiving said input signal, the output of said analog integrator and the output of a 1 bit A/D converter and estimating the overload state of said mixed mode integrator; and a fourth digital adder for adding the output of said overload estimator to the signal obtained by adding the final output of the modulator to the output of said 1 bit A/D converter via the second digital adder, a mixed mode integrator which has an analog integrator and a digital integrator composed of a digital adder and a digital storing unit and integrates the output of said overload estimating unit in analog or digitally; and a quantization unit for converting the output of said mixed mode integrator to a digital signal, an N-th order sigma-delta modulator having N overload estimating units and N mixed mode integrators.

3. A sigma-delta analog-to-digital converter having an optional anti-aliasing filter, an optional sample and hold circuit, a sigma-delta modulator and an optional decimation filter, comprising:

an overload estimating unit for judging the saturation or overload of an analog integrator;

a mixed mode integrator which has an analog integrator and a digital integrator composed of a digital adder and a digital storing unit and integrates the output of said overload estimating unit in analog or digitally; and a quantization unit for converting the output of said mixed mode integrator to a digital signal, wherein said quantization unit comprises a N bit A/D converter for A/D converting N bits of the output of said analog integrator; and a fifth digital adder for adding the output of said N bit A/D converter to the output of said digital integrator, thereby digitally feedback the final output of said quantization unit to said overload estimating unit without analog feedback, an N-th order sigma-delta modulator having N overload estimating units and N mixed mode integrators.

* * * * *